FREQUENCY MODULATION RECEIVER TUNING AID

Filed April 26, 1945

2 Sheets-Sheet 1

INVENTOR.
Wendell L. Carlson
BY H. S. Grover
ATTORNEY.

March 21, 1950 W. L. CARLSON 2,501,120

FREQUENCY MODULATION RECEIVER TUNING AID

Filed April 26, 1945 2 Sheets-Sheet 2

INVENTOR.
Wendell L. Carlson
BY H. S. Grover
ATTORNEY.

Patented Mar. 21, 1950 2,501,120

UNITED STATES PATENT OFFICE 2,501,120

FREQUENCY MODULATION RECEIVER TUNING AID

Wendell L. Carlson, Princeton, N. J., assignor to Radio Corporation of America, a corporation of Delaware Application April 26, 1945, Serial No. 590,463

6 Claims. (Cl. 250—20)

My present invention relates generally to improved tuning aids for angle modulated carrier wave receivers, and more particularly to novel means for obtaining improved tuning characteristics and reducing inter-channel noise in frequency modulation (FM) receivers.

In receiving amplitude modulated (AM) carrier waves, such as those in the present broadcast range of 550 to 1700 kilocycles (kc.), it is relatively simple to tune the receiver by merely listening to the variation in sound output volume of the loud-speaker while actuating the station selecting device. Accurate tuning to the carrier is indicated by maximum sound output; the sound falling off appreciably, especially when automatic volume control is not employed, on either side of the correct tuning position of the station selecting device. However, in tuning a receiver of angle modulated carrier waves, such as a usual FM receiver, the user is confused because he finds spurious maximum sound output points, including substantial but distorted signal components, on either side of the correct tuning position of the station selecting device.

Additionally, in tuning an FM receiver it is found that there is a relatively sharp increase in noise on either side of the correct tuning position accompanying the aforesaid spurious signal components. It will, therefore, be seen that the need for accurate tuning, in the case of FM receivers, is even greater than for AM receivers. In general, this need for more accurate tuning follows from the fact that detection occurs in the case of an FM receiver along a curve somewhat resembling the letter S and possessing three successive slopes along which detection may occur, although proper reception can be obtained only on the middle slope. By virtue of the fact that signal reception, accompanied by distortion and noise, may be obtained when the FM receiver is tuned away from the correct center frequency position, the set user may even feel that his receiver is defective rather than incorrectly tuned.

It may, therefore, be stated that it is one of the main objects of my present invention to provide improved aids to manual tuning of a receiver of angle modulated waves, maximum sound output occurring only at the correct tuning position of the station selector device for a given carrier channel. More specifically, I obtain such results in an FM receiver, together with reduction of signal distortion and inter-channel noise.

In carrying out the object of my invention, I employ a squelch circuit for the modulation frequency (generally audio) controlled by rectified voltage from the detector circuit whereby the audio frequency amplifier of the system is substantially operative only when the receiver is tuned near to the center or mid-band frequency of the received waves.

Yet other objects of my invention are to provide tuning aids for FM receivers which are reliable in operation and can be economically manufactured and assembled.

Still other features of my invention will best be understood by reference to the following description, taken in connection with the drawing, in which I have indicated diagrammatically several circuit organizations whereby my invention may be carried into effect.

Figure 6:
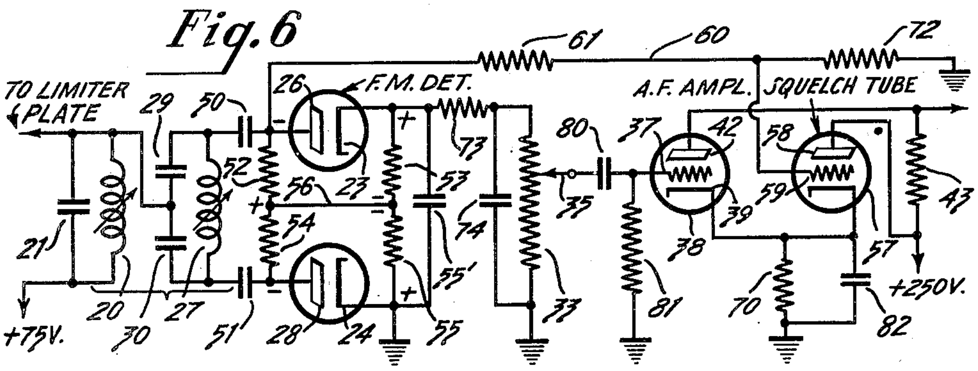
Fig. 6 shows a modification of the system of Fig. 2.
Figure 8:
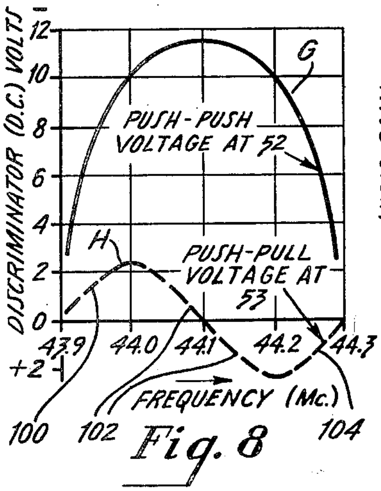
Figure 7:
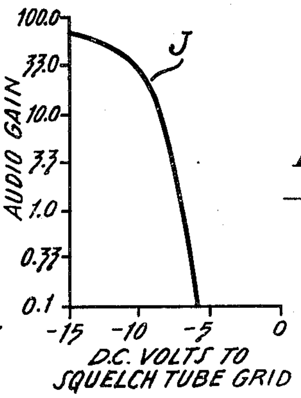

Fig. 7 graphically depicts the effect on the audio gain in the system of Fig. 6; and Fig. 8 graphically and ideally illustrates the FM detector output voltages.

Figures 1, 2, 3:
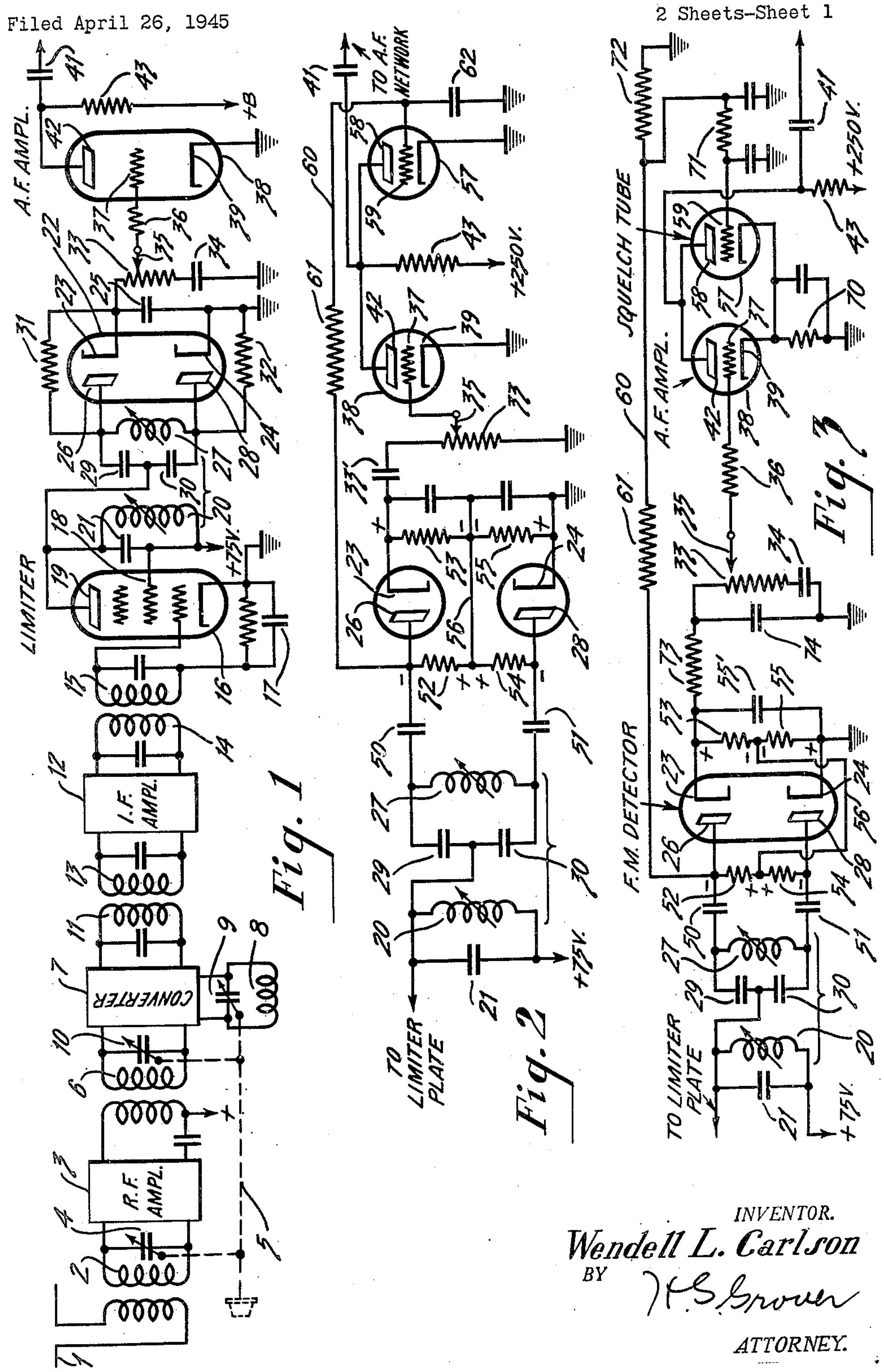
Fig. 1 shows a circuit diagram of an FM receiver employing one embodiment of my invention.
Fig. 2 shows another embodiment of my invention.
Fig. 3 shows a suitable embodiment employing the embodiments of Figs. 1 and 2 in one system.

Referring now to Fig. 1, there is shown therein the circuit connections of only so much of an FM receiver as is necessary to a proper understanding of the present invention. The remainder of the system is schematically represented, since those skilled in the art of radio communication are fully aware of the apparatus required. It is well known that in present FM broadcast reception the superheterodyne type of receiver is widely employed. My invention is not restricted to any particular band of FM reception, nor to FM wave reception. The generic term "angle modulated" covers both frequency and phase modulation, as well as hybrid modulations possessing characteristics common to both. The present assigned channel width for each FM stage is 200 kc. It is to be understood that the present invention is in no way restricted to any given channel width for each FM station.

Assuming for the purpose of specific illustration that the receiver shown in Fig. 1 is designed to receive FM stations in the present FM band of 42–50 megacycles (mc.), the FM waves are collected by any desired type of signal collector device. For example, the dipole 1 is coupled to the tunable signal selector input circuit 2 of a radio frequency amplifier 3. The selector circuit 2 is provided with a tuning reactance, which may be a variable condenser 4, and the station selector device 5 of any suitable construction is arranged to vary the capacitance of condenser 4 to a value such as to tune the circuit 2 to the mid-band or center frequency of a desired FM station. The amplified radio frequency signal energy, after proper selection, may be selectively amplified in one or more additional stages of radio frequency amplification prior to impression of the FM waves upon the tunable input circuit 6 of the first detector or converter stage 7.

As is well known, the converter 7 is provided with a local oscillator network, either independent of the converter or combined therewith, whose tank circuit 8 is tunable by variable condenser 9 over a range of local oscillator frequencies which differ from frequencies of the signal frequency range by the constant value of the intermediate frequency (I. F.). The I. F. value may be, for example, 4 mc. The station selector device 5 concurrently varies the capacitance of each of variable condensers 4, 10 and 9 so that there is produced in the resonant output circuit 11 of the converter 7 signal energy whose mid-band or center frequency has the I. F. value of 4 mc. The I. F. energy produced at output circuit 11 may be amplified by an I. F. amplifier network 12. The latter may include one or more I. F. amplifier tubes. Numerals 13 and 14 indicate respectively the input and output circuits of the I. F. amplifier, while numeral 15 indicates the resonant input circuit of the following amplitude limiter tube 16. It will be understood that each of resonant circuits 11, 13, 14 and 15 is tuned to the operating I. F. value.

The limiter circuit may be of any suitable and well-known construction, and includes a resistor-condenser network 17 in the low potential side of its input circuit 15 so as to provide grid limiting action on the negative half cycles of the signal waves. The screen grid 18 and plate 19 are respectively operated at a relatively low positive voltage of +75 volts thereby to provide plate limiting on the positive half cycles of the signal input waves. In circuit with the plate 19 there is included a parallel resonant circuit consisting of coil 20 shunted by condenser 21. The circuit 20, 21 is tuned to the operating I. F. value, and constitutes the primary circuit of the FM discriminator network.

The limiter tube is followed by an FM detector circuit which is generally a discriminator-rectifier circuit of the type disclosed and claimed by S. W. Seeley in his U. S. Patent No. 2,121,103 granted June 21, 1938. More specifically, I have shown an FM detector circuit whose specific construction has been disclosed and claimed by W. R. Koch in his application Serial No. 529,074, filed April 1, 1944, which has matured into Patent No. 2,410,983 of November 12, 1946. It is to be clearly understood, however, that my present invention is in no way limited to the specific form of FM detector circuit shown, since the squelch control circuit utilized herein will function satisfactorily in conjunction with any other suitable type of FM detector circuit. Before describing the circuit details and functioning of the squelch, or muting, network, there will be described the remainder of the FM receiver system and the problem sought to be solved by my present invention.

A pair of opposed diode rectifiers are shown located in a common tube envelope 22, as in a 6H6 type tube. The cathodes 23 and 24 of the respective diodes are coupled by capacitor 25, cathode 24 being directly grounded. The anode 26 of the upper diode is connected to the upper end of the secondary coil 27, while the anode 28 of the lower diode is connected to the lower end of secondary coil 27. The coils 20 and 27 are magnetically coupled, and coil 27 is shunted by the condensers 29 and 30 which are connected in series. The secondary circuit 27, 29, 30 is resonated to the operating I. F. value, and the high potential side of primary coil 20 is directly connected to the junction of condensers 29 and 30. The arrows through coils 20 and 27 indicate that these coils are adapted to have their inductance values adjustable thereby to provide means for adjusting the frequency of the respective primary and secondary circuits of the discriminator network. Under present standards of FM broadcast reception, the frequency swing may be up to a maximum of 150 kc., i. e. the deviation on each side of the mean frequency may be up to 75 kc. All of the resonant circuits mentioned herein are designed to respond efficiently to the full swing of the received signal, which may be over the above, or other suitable, frequency range.

Due to the direct connection from the primary circuit 20, 21 to the junction of condensers 29 and 30, the primary voltage is applied in parallel to each of anodes 26 and 28. Concurrently, the magnetic coupling of the coils 20 and 27 results in the application of the primary circuit voltage to the anodes 26 and 28 in opposed phase relation. However, at each of the anodes 26 and 28 there will exist a quadrature phase relation between each pair of the aforesaid primary voltage components. This quadrature phase relation exists solely when the I. F. energy at circuit 20, 21 is at the mid-band or center frequency of the response curves of circuits 20, 21 and 27, 29, 30. Hence, the resultant voltages at each of anodes 26 and 28 will be equal for the "in-tune" condition. However, these resultants, when operative on the middle slope of the discriminator characteristic, will be unequal to an extent and in a direction dependent respectively upon the degree and sense of frequency departure of the I. F. energy at circuit 20, 21 with respect to the center frequency of the response curves of circuits 20, 21 and 27, 29, 30.

These resultant voltages are rectified by each of diodes 23, 26 and 24, 28, and the corresponding rectified voltages are developed across the respective load resistors 31 and 32 shunted directly between the anode and cathode of each diode. Since the cathode 24 is grounded and the coil 27 provides a direct current connection between resistors 31 and 32, the cathode end of resistor 31 will have an effective, or resultant, rectified voltage which is the differential of the voltages across load resistors 31 and 32. This differential voltage is representative of the modulation signal which was originally applied to the FM carrier at the FM transmitter station. Condenser 25 is an I. F. bypass condenser, and is shunted by potentiometer resistor 33 and condenser 34 connected in series. Condenser 34 functions primarily to prevent grounding of the direct current voltage output of the FM detector. The slider 35 takes off from resistor 33 a desired amplitude of audio frequency voltage. Resistor 36, of relatively high value, connects slider 35 to control grid 37 of amplifier tube 38.

The FM detection characteristic, which follows the contour of curve H, Fig. 8, is well known to those skilled in the art of FM radio communication. It is substantially a characteristic which is provided with a pair of spaced peaks located beyond the limiting frequency swings of the FM waves. On either side of the spaced peaks, and between the peaks, there exist slopes 100, 102 and 104 respectively which make it possible for the detector to detect on any one of the three slopes of the characteristic. The correct tuning position is at the center, indicated as 44.1 mc., of the inclined slope 102 between the spaced peaks. That is, the resonant frequency of the primary and secondary circuits of the discriminator network determines the center of the inclined slope between the spaced peaks of the FM detection characteristic. When the selector device 5 is adjusted correctly, the received FM signals produce I. F. energy whose center frequency falls accurately at the desired center frequency value of the FM detection characteristic.

Assuming that the station selector 5 has been adjusted to the exact mid-band frequency of a desired FM station, the voltage developed across resistor 33, i. e. the audio output voltage, will have a maximum value for the degree of modulation of the FM waves. This voltage is applied over slider 35 and resistor 36 to the control grid 37 of audio frequency amplifier tube 38. The cathode 39 is connected to ground, while control grid 37 is returned to ground for direct current through a path comprising resistor 36, slider 35, resistor 33, resistor 31, coil 27 and resistor 32. The plate 42 of audio frequency amplifier 38 is connected through load resistor 43 to a suitable source +B of positive potential, say +250 volts. The audio voltage across resistor 43 is transmitted through the audio coupling condenser 41 to one or more following audio frequency amplified tubes terminated by a suitable loud-speaker. The potentiometer 33, 35 controls the audio voltage delivered to tube 38. The resistance 36 and the grid to ground capacity of tube 38 may cooperate to function as a deemphasis circuit for attenuating higher audio frequencies.

Figure 5:
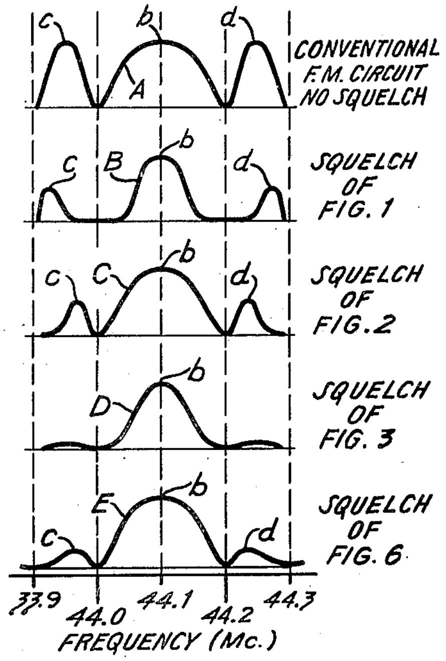
Fig. 5 shows graphically and ideally the comparative audio response secured when employing the systems of Figs. 1, 2, 3 and 6.

Attention is now directed to curve A in Fig. 5 which shows the audio response of the receiving system of Fig. 1 (assuming the present invention not present) during actuation of selector 5 to tune through an FM station whose carrier frequency is 44.1 mc. Considerable confusion occurs as the station is sought to be correctly tuned in by virtue of the existence of spurious peaks, indicated by the reference letters *c* and *d* and at which the desired signal is heard on either side of the desired central peak *b*. In addition, the confusion is augmented by the fact that the noise disturbance increases rapidly at settings corresponding to the spurious peaks *c* and *d*. The desired noise-free and distortion-free performance is obtained only when the receiver is tuned to peak *b*.

Fig. 1 includes squelch circuits which depend for their operation upon the development of direct current voltages across the respective load resistors 31 and 32. Let it be assumed that the receiver has been tuned accurately. For this condition the rectified voltages across resistors 31 and 32 are equal, and the effective voltage at the cathode end of resistor 31 is zero by virtue of the fact that the rectified voltages are in polarity opposition. Hence, the grid 37 derives no bias voltage from the detector, and the audio gain is near maximum.

If, now, the receiver is tuned towards that side of the FM channel such as to cause the rectified voltage across resistor 32 to exceed the rectified voltage across resistor 31, the effective potential applied to grid 37 will be increasingly negative, and will rapidly reduce the gain of the tube until substantial cut-off bias is applied to grid 37. Continued detuning of the receiver will cause the negative bias applied to grid 37 to remain of high value, until the signal input is relatively small. At this point there will be a reduction of the negative bias applied to grid 37 and the audio gain will be restored. This explains, therefore, why the spurious peak, for example, *c* appears at one of the extreme limits of the channel.

If, on the other hand, the receiver is detuned from resonance in the opposite direction, the effective potential at the cathode end of resistor 31 becomes increasingly positive with respect to ground. This results from the fact that the rectified voltage across resistor 31 now exceeds the voltage across resistor 32. As the bias of grid 37 is varied in a positive polarity sense, it eventually becomes sufficiently positive to cause grid current to flow. The resulting increase in grid current in effect shunts a low resistance load across the input circuit of the audio amplifier. As a result most of the direct current voltage and audio frequency voltage is expended across resistor 36. This is manifested by a rapid drop of audio response as actuation of the selecting device 5 continues. The signal voltage applied to the detector next becomes relatively small thereby causing the positive bias applied to grid 37 to be reduced. The loading effect of the grid current is correspondingly reduced, and for this reason the spurious peak *d* appears in the audio response curve B. Adjustment of the potentiometer 33, 35 does not substantially affect the direct current squelch voltages above described. The curve B shows the audio response of the system of Fig. 1. Manifestly curve B marks a considerable improvement over curve A. The sound output rises and falls with much less distortion as the receiver selector 5 is adjusted, for example, from 33.9 to 44.3 mc. The effect on the listener between these limits is much as if he were tuning an amplitude modulation receiver. However, the spurious peaks *c* and *d* occur respectively below and above the channel, and for this reason it is desirable that the performance of the circuits be further improved.

The operation of the form of squelch circuit shown in Fig. 2 will now be described. In Fig. 2 I have only shown the discriminator, rectifier and audio amplifier networks of the system of Fig. 1, it being understood that the remainder of the system is similar. The diodes 23, 26 and 24, 28 are shown located in separate tube envelopes, although they can be in a common envelope as in Fig. 1. Anode 26 is coupled by condenser 50 to one end of coil 27, while condenser 51 couples anode 28 to the opposite end of secondary coil 27. The diodes, in this modification, are provided with load resistors arranged in a manner different from that shown in Fig. 1. Here, diode 23, 26 is shunted by a pair of load resistors 52 and 53 arranged in series, while diode 24, 28 is shunted by resistors 54 and 55 also arranged in series relation. Resistors 52 and 54 may be a single resistor whose mid-point is connected by lead 56 to the mid-point of resistor 53, 55. The cathode end of resistor 55 is grounded, and each of resistors 53 and 55 is shunted by a respective I. F. bypass condenser.

The audio amplifier tube 38 has its grid 37 connected through slider 35 to the potentiometer resistor 33. In this modification the lower end of resistor 33 is grounded, while the upper end thereof is connected through the audio frequency coupling condenser 33' to the cathode end of resistor 53. Thus audio frequency voltage only is applied to the grid 37, unlike Fig. 1 where direct current voltage is also applied to grid 37. Tube 38 is preferably a high-mu tube, and its load resistor 43 is shunted by the plate impedance of tube 57 which is relatively a low-mu tube. The plate 58 of tube 57 is connected to the plate end of resistor 43, while the cathode of tube 57 is grounded. The grid 59 of tube 57 is connected by lead 60 and resistor 61 to the anode end of resistor 52, the grid 59 being bypassed to ground by condenser 62 for alternating current components. The audio frequency signals are taken off from across resistor 43, and are transmitted to the subsequent audio signal utilization network through the coupling condenser 41.

In this circuit the tube 57 acts as a variable load on the plate circuit of the audio amplifier tube 38. While I have indicated the plate 42 as having a plate voltage of +250 volts applied thereto, it will be understood that any normal plate voltage may be employed. Any load resistance 43, such as one having a value of 200,000 ohms, may be employed. The tube 57 with zero or −1 volt on its grid 59 will function both to reduce the plate potential of tube 38 below +50 volts and the effective load resistance below 100,000 ohms. The net result will be substantially to reduce the gain of the audio stage when grid 59 has an effective voltage applied thereto near zero. The curve C of Fig. 5 illustrates the type of audio response secured with the squelch arrangement of Fig. 2. As the receiver is tuned into the side of the desired FM channel the audio gain does not open up until a substantial negative voltage is passed on to the grid 59 from the detector circuit.

The operation of the squelch circuit of Fig. 2 depends upon the fact that the voltage applied to grid 59 is the sum of the rectified voltages across resistors 52 and 55. This is readily seen by noting that lead 60 returns to ground through resistor 52, lead 56 and resistor 55 in series. Hence, when the receiver is accurately tuned to the center of a desired FM channel the voltages across resistors 52 and 55 will be equal, but will be added in like polarity. Of course, the voltages across resistors 53 and 55 are added differentially, and the resultant voltage thereacross represents the audio frequency signal. In the case of the voltage taken off by lead 60, the resistor 61 and condenser 62 act as a filter network to eliminate all alternating current components from the direct current bias voltage applied to grid 59.

For the accurate tuning condition, therefore, the grid 59 has a high negative bias which effectively cuts off plate current in tube 57. As a result the amplifier 38 has maximum gain, since it is operating with normal plate voltage. However, as the receiver is tuned away from exact resonance, and in either direction, the additive or push-push voltage applied over lead 60 becomes less negative. Hence, the tube 57, being a low mu tube, becomes effective to load the plate circuit of tube 38. The loading effect will be a maximum at the limits of the FM channel.

By combining the action of both squelch circuits, as indicated in Fig. 3, it is possible to provide an audio response of a more satisfactory type. The curve D in Fig. 5 illustrates the audio performance of the squelch arrangement shown in Fig. 3. In Fig. 3, the diodes 23, 26 and 24, 28 are shown in a common tube envelope, and are provided with the four load resistors 52, 53, 54 and 55. The lower end of resistor 55 is grounded. The condenser 55' is shunted across the output resistors 53 and 55, and bypasses I. F. currents. The audio amplifier tube 38, again a high mu tube, has its cathode 39 connected to ground through a bias resistor 70 of about 2000 ohms. This cathode resistor 70 is optional for tube 38 in Figs. 1, 2 and 3, and for tube 57 in Figs. 2 and 3. The cathode of low mu tube 57 is connected to the upper end of resistor 70. Hence, the voltage drop across resistor 70 provides normal negative bias for the grids 37 and 59 respectively of the amplifier tube 38 and the squelch tube 57. The plates 42 and 58 are connected in common to the upper end of load resistor 43, which may have a magnitude of 200,000 ohms. Normal voltage of +250 volts is applied to both plates through resistor 43. The grid 59 is connected by lead 60 to the anode end of resistor 52. The additional filter network 71 is inserted in circuit with lead 60 to insure that there will be no alternating current voltage applied to grid 59. The resistor 72 to ground provides a grid bias return path for grid 59.

The grid 37 of amplifier 38 is connected through high resistance 36 to the slider 35 of potentiometer 33. Resistor 36 may have a magnitude of about 500,000 ohms. The upper end of potentiometer resistor 33 is connected by resistance 73 to the cathode end of resistor 53. Condenser 74 shunts the potentiometer to ground for I. F. currents. In the arrangement of Fig. 3 the audio gain of tube 38 is controlled by variation in grid bias, grid load, plate voltage and plate load. The variable control bias of grid 37 is essentially derived from the push-pull direct current voltage existing across resistors 53 and 55. When this push-pull voltage goes either positive or negative, the audio stage gain drops in accordance with curve F in Fig. 4. This curve depicts the change in audio gain as the differential direct current voltage between the cathode end of resistor 53 and ground varies from zero to either −4 or +4 volts as the receiver is tuned from resonance in either direction.

Figure 4:
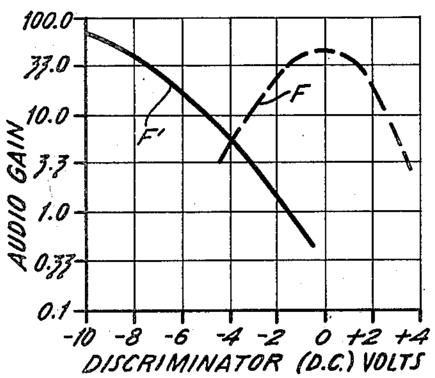
Fig. 4 shows graphically the effect on the audio gain of the squelch circuits in Figs. 1 and 2.

As in Fig. 2, the grid 59 of squelch tube 57 derives its bias voltage from the push-push voltage across resistors 52 and 55. Here, again, it will be noted that the plate 58 of tube 57 connects to the plate 42 of amplifier 38 so as to drop the plate voltage and load resistance of tube 38 when the negative bias voltage on grid 59 becomes less than a predetermined value. In Fig. 4 the curve F' shows the predetermined maximum negative voltage to be −10 volts, and the curve shows the drop in audio gain as the negative voltage decreases. In other words, the tube 57 is ineffective to reduce the plate voltage and plate load of tube 38 so long as the voltage at the anode end of resistor 52 is more negative than −10 volts. The circuit is arranged so that the squelch tube will provide reduction of audio response at the first and third tuning response points *c* and *d* of curve B. The curve D of Fig. 5 shows the relatively small spurious peaks which remain by virtue of the squelch action of tube 57 combined with the direct current bias voltage impressed on grid 37. The action of the push-pull direct current voltage, Figs. 1 and 3, sharpens the three tuning points, as well as reducing the spurious peaks, while the squelch tube utilizing the push-push voltage, Figs. 2 and 3, substantially completes the suppression of the spurious first and third tuning response points.

In Fig. 6 I have shown a modification of the squelch tube connection, wherein the audio gain is controlled through variable cathode bias on the amplifier tube 38. The FM detector network is constructed much the same as in Fig. 2. The four resistors 52, 53, 54 and 55 may each have a magnitude of 50,000 ohms. The potentiometer resistor 33 is connected from resistor 73 to ground, and grid 37 of audio amplifier tube 38 is coupled to slider 35 through direct current blocking condenser 80. The grid 37 is returned to ground for direct current by resistor 81. The squelch tube 57 has its cathode connected to the ungrounded end of common cathode bias resistor 70, having a value of about 2000 ohms for the 6SQ7 tube, which is bypassed by condenser 82 for audio currents. The plate 58 of the squelch tube is connected to the lower end of load resistor 43 which may have a value of 200,000 ohms. A voltage of +250 volts may be applied to the plate 58 of the low-mu tube 57, for which I have used a type 6J5, while the voltage applied to plate 42 of the high-mu tube 38 is reduced due to resistor 43.

The bias of grid 59 depends on the potential at the anode end of resistor 52. The push-push, or additive, combination of the rectified voltages across resistors 52 and 55 is applied over lead 60 to grid 59. The bias of grid 37 is determined by the voltage across cathode resistor 70, and the latter varies in dependence on the value of the direct current potential at the anode end of resistor 52. The ratio of the magnitudes of resistors 61 and 72 is so chosen as to deliver a maximum potential of about −11 volts to the grid 59 of tube 57. The variation of push-push voltage with frequency change is depicted by solid line curve G in Fig. 8. It will be seen that at the center frequency of 44.1 mc. (the carrier frequency of the desired FM station) the sum of the negative voltages across resistors 52 and 55 is a maximum. In either direction from center frequency, however, the magnitude of the additive voltage falls.

The use of loose coupling between primary circuit 20, 21 and secondary circuit 27, 29, 30 aids in narrowing curve G, that is, the rate of decrease of the push-push voltage may be increased by increasing the selectivity of the discriminator network. Curve H, the broken line curve in Fig. 8, depicts the push-pull or differential output voltage at the cathode end of resistor 53. The contrast between curves G and H reveals the advantage in using the push-push voltage for squelch control. It is, also, pointed out that curve H depicts the direct current voltage impressed on grid 37 in Figs. 1 and 3.

To explain, now, the operation of the squelch circuit of Fig. 6, let it be assumed that no signals are being received, or that the receiver is tuned between FM stations. In such case there is no rectified voltage developed across the load resistors 52 or 55. Hence, the bias of grid 59 is determined by the voltage drop across resistor 70. Reference to curve J of Fig. 7 shows that for minimum negative bias on the grid 59 of the squelch tube the gain of audio tube 38 is a minimum. This follows from the fact that maximum space current flow of tube 57 produces a maximum voltage across resistor 70, and the latter voltage negatively biases grid 37 to cut-off condition. If, now, the receiver is tuned into the FM channel, the push-push voltage at the anode end of resistor 52 increases in a negative sense to a maximum value.

Hence, the grid 59 is biased increasingly negative thereby reducing the voltage drop across common cathode resistor 70. This causes the gain of audio amplifier 38 to rise, as shown by curve J of Fig. 7. At the center frequency of the FM channel the negative bias applied to the squelch tube grid is a maximum thereby permitting audio amplifier tube 38 to operate at full gain. Detuning of the receiver in the opposite sense results in a reduction of the gain of the audio stage. Hence, the FM detector provides a push-push voltage varying with the degree of off-tuning from center frequency to render effective a squelch tube functioning to suppress audio gain for such off-tuning. The spurious tuning responses are thereby very largely eliminated as indicated in curve E of Fig. 5, and inter-channel noises are also reduced.

What I claim is:

1. In combination with a pair of opposed rectifiers having respective load resistors, discriminator means for applying frequency modulation signals to said rectifiers, an audio amplifier tube having a modulation signal input connection differentially to derive from the resistors the rectified voltages thereacross, means for additively deriving from the resistors a direct current voltage which is negative and whose value is a maximum in response to said frequency modulation signals having a mean frequency equal to the predetermined frequency of said discriminator, and means, responsive to said negative voltage decreasing below said maximum value, for rendering said audio amplifier ineffective.

2. In combination with a pair of opposed rectifiers having respective load resistors, discriminator means for applying radio frequency voltages derived from frequency modulation signals to said rectifiers, an audio amplifier tube having a modulation signal input connection differentially to derive from the resistors the rectified voltages thereacross, means for additively deriving from the resistors a direct current voltage which is negative and whose value is a maximum in response to said frequency modulation signals having a mean frequency equal to the predetermined frequency of said discriminator, a tube connected to act as a plate load on said audio tube, and means, responsive to said negative voltage decreasing below said maximum value, and controlling the conductivity of said load tube to render said audio amplifier ineffective.

3. In combination with a frequency modulation detector having load impedance elements for developing thereacross a modulation signal component and a direct current voltage component in response to an impressed frequency-modulated carrier wave, a modulation signal amplifier having a cathode, a control grid and an anode, means providing a single direct current and alternating current path between said load impedance elements and said control grid and including a resistor serially connected to impress both of said components simultaneously on said control grid, means for connecting said cathode and one terminal of said load impedance elements to a relatively fixed potential, and an output impedance element connected to said anode, said resistor being of such a magnitude as to develop a squelch voltage thereacross in response to the flow of grid current caused by a positive direct voltage being developed across said load impedance elements.

4. In combination with a pair of opposed rectifiers having respective load resistors, discriminator means for applying radio frequency voltages derived from frequency modulation signals to said rectifiers, means for differentially deriving from said resistors a rectified modulation signal component and a direct current voltage component, a modulation signal amplifier having a cathode, a control element and an anode, a conductive connection including a further resistor between said differential deriving means and said control element for impressing both of said components on said control element, means for additively deriving from said resistors a direct current voltage which is negative and whose value is a maximum in response to said frequency modulation signals having a mean frequency equal to the predetermined frequency of said discriminator means, a squelch tube connected to act as an anode load on said modulation signal amplifier, and means responsive to said negative voltage decreasing below said maximum value and controlling the conductivity of said squelch tube to render said modulation signal amplifier ineffective.

5. In combination with a pair of opposed rectifiers having respective load resistors, a discriminator network for applying radio frequency voltages derived from frequency modulation signals to said rectifiers, means for differentially deriving from said resistors a rectified audio signal component and a direct current voltage component, an audio signal amplifier having a cathode, a control element and an anode, a further resistor connected directly between said differential deriving means and said control element for impressing both of said components on said control element, means for additively deriving from said resistors a direct current voltage which is negative and whose value is a maximum in response to said frequency modulation signals having a mean frequency equal to the predetermined frequency of said discriminator network, a squelch tube having a cathode, control grid and anode, a common load element for said anodes, a common biasing network for said cathode, and means for impressing said negative voltage on the control grid of said squelch tube.

6. In combination with a pair of opposed rectifiers having respective load resistors, discriminator means for applying radio frequency voltages derived from frequency modulation signals to said rectifiers, an audio amplifier having a cathode, a control element and an anode, said audio amplifier having a modulation signal input connection to its control element and cathode differentially to derive from said resistors the rectified voltages thereacross, a load impedance element connected to said anode, means for additively deriving from said resistors a direct current voltage which is negative and whose value is a maximum in response to said frequency modulation signals having a mean frequency equal to the predetermined frequency of said discriminator means, a squelch tube having a cathode, a control element and an anode, a common bias network for both of said cathodes, and means coupled between the control element and the cathode of said squelch tube and responsive to said negative voltage decreasing below said maximum value for controlling the conductivity of said squelch tube to render said audio amplifier ineffective.

WENDELL L. CARLSON.

REFERENCES CITED

The following references are of record in the file of this patent:

UNITED STATES PATENTS

| Number | Name | Date |
|---|---|---|
| 2,209,330 | Haffcke | July 30, 1940 |
| 2,231,371 | Roberts | Feb. 11, 1941 |
| 2,233,199 | Donley | Feb. 25, 1941 |
| 2,244,639 | Budelman | June 3, 1941 |
| 2,261,643 | Brown | Nov. 4, 1941 |
| 2,263,633 | Koch | Nov. 25, 1941 |
| 2,264,019 | Case | Nov. 25, 1941 |
| 2,272,052 | Reid | Feb. 3, 1942 |
| 2,276,488 | Hershey | Mar. 17, 1942 |
| 2,296,092 | Crosby | Sept. 15, 1942 |
| 2,296,101 | Foster | Sept. 15, 1942 |
| 2,301,649 | Thompson | Nov. 10, 1942 |
| 2,330,902 | McCoy | Oct. 5, 1943 |
| 2,362,806 | Dome | Nov. 14, 1944 |
| 2,369,585 | Lyman | Feb. 13, 1945 |
| 2,371,397 | Koch | Mar. 13, 1945 |
| 2,381,754 | Jadraque et al. | Aug. 7, 1945 |
| 2,410,983 | Koch | Nov. 12, 1946 |
| 2,413,348 | Hammond | Dec. 31, 1946 |